United States Patent
Winger et al.

(10) Patent No.: US 11,349,475 B1
(45) Date of Patent: May 31, 2022

(54) SYSTEMS AND METHODS FOR REALLOCATION OF ELECTRONIC FUSES CONFIGURED TO DRIVE A FUSE HARNESS OPERATIONALLY COUPLED TO MULTIPLE LOADS IMPLEMENTED ONBOARD A VEHICLE

(71) Applicant: GM GLOBAL TECHNOLOGY OPERATIONS LLC, Detroit, MI (US)

(72) Inventors: Lyall Kenneth Winger, Waterloo (CA); James Morrison, Sebringville (CA); Suresh Gopalakrishnan, Troy, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/404,416

(22) Filed: Aug. 17, 2021

(51) Int. Cl.
| | |
|---|---|
| B60L 1/00 | (2006.01) |
| B60L 3/00 | (2019.01) |
| H02G 3/00 | (2006.01) |
| H03K 17/56 | (2006.01) |
| B60R 16/02 | (2006.01) |

(52) U.S. Cl.
CPC ............. *H03K 17/56* (2013.01); *B60R 16/02* (2013.01)

(58) Field of Classification Search
CPC . Y02T 10/7005; Y02T 10/7077; B60R 16/03; B60R 16/0315; B60L 11/14
USPC ........................................................ 307/9.1
See application file for complete search history.

(56) References Cited

U.S. PATENT DOCUMENTS

| | | | |
|---|---|---|---|
| 9,227,581 B1 * | 1/2016 | Gauthier | ................. B60R 16/03 |
| 2020/0156570 A1 * | 5/2020 | Bang | ......................... G05F 1/10 |
| 2020/0389012 A1 * | 12/2020 | Nakamura | ............. H02H 3/087 |

* cited by examiner

*Primary Examiner* — Quan Tra
(74) *Attorney, Agent, or Firm* — Lorenz & Kopf LLP

(57) ABSTRACT

Systems and methods for reallocation of electronic fuses (EFn). The method includes concurrently receiving, for a plurality (N) of EFn, respective sensor data and comparing the sensor data to respective operating ranges. An EFn that exceeds its operating range is turned off. Wherein a preprogrammed configuration of a fuse harness defines multiple (M) clusters, the method identifies, for each EFn that is within the operating range, whether the EFn is a member of a cluster of the M clusters, and other members of the cluster. The method monitors each cluster member's sensor data, with respect to preprogrammed thresholds and load current demands, to thereby categorize each EFn in each cluster as either healthy, derated, or failed. For failed EFns, a target EF in the same cluster having a reallocation potential is identified, and its fuse limits are modified in accordance with the reallocation potential.

20 Claims, 4 Drawing Sheets

US 11,349,475 B1

SYSTEMS AND METHODS FOR REALLOCATION OF ELECTRONIC FUSES CONFIGURED TO DRIVE A FUSE HARNESS OPERATIONALLY COUPLED TO MULTIPLE LOADS IMPLEMENTED ONBOARD A VEHICLE

TECHNICAL FIELD

The present disclosure generally relates to automated energy distribution in mobile platforms, and more particularly relates to systems and methods for reallocation of electronic fuses (EF) configured to drive a fuse harness operationally coupled to multiple loads implemented onboard a vehicle.

Smart electronic fuses (EF) are sometimes used to meet load current demands in vehicle applications. However, a technical problem is presented in that each model and variation of a vehicle may have its own arrangement of loads, each load having its own load current demand, which results in having to reconfigure an array of smart EFs for each new iteration of a vehicle.

The following disclosure provides a technological solution to these technical problems, in addition to addressing related issues. Furthermore, other desirable features and characteristics of the system and method will become apparent from the subsequent detailed description and the appended claims, taken in conjunction with the accompanying drawings and the preceding background.

SUMMARY

In an embodiment, a system for reallocation of electronic fuses (EF) configured to drive a fuse harness operationally coupled to multiple loads, implemented onboard a vehicle, is provided. The system includes: an EF array comprising a plurality (N) of electronic fuses (EFn); a controller circuit comprising a processor operationally coupled to the EF array, and programmed to, concurrently receive, for each EFn, a respective load current (EFn_i) and temperature (EFn_T); compare, for each EFn, the respective EFn_i to an operating range for the EFn; turn off each EFn for which the EFn_i is not within the operating range, and generate a respective load current alert responsive thereto; wherein a preprogrammed configuration of the fuse harness defines multiple (M) clusters, determine, for each EFn_i that is within the operating range, whether the respective EFn is a member of a cluster of the M clusters; identify other members of the cluster, responsive to determining that EFn is the member of the cluster; for each member of the cluster, for a preprogrammed duration of time, perform comparisons of the respective EFn_i to a preprogrammed load current expectation, and of the respective EFn_T to a preprogrammed temperature threshold; upon an expiration of the preprogrammed duration of time, categorize each EFn in the cluster as either healthy, derated, or failed, as a function of the EFn_i and the EFn_T comparisons; generate, for each EFn categorized as derated, a derated alert for the EFn; and for each EFn that is categorized as failed, identify another member of cluster as a target EF having a reallocation potential that is consistent with the preprogrammed configuration of the fuse harness; and modify fuse limits of the target EF in accordance with the reallocation potential.

In one embodiment, the reallocation potential includes a capacity to support an increased load current, and the controller circuit is further programmed to modify the fuse limits of the target EF by increasing the load current of the target EF.

In one embodiment, the controller circuit is further programmed to, after modifying the fuse limits of the target EF, turn off the respective EFn that is categorized as failed, and generate an alert indicating that the cluster has been modified.

In one embodiment, the controller circuit is further programmed to reference preprogrammed EF data, for each EFn, to determine the preprogrammed load current expectation.

In one embodiment, the preprogrammed configuration of the fuse harness specifies an arrangement and location of each cluster of the M clusters, and the arrangement and location of each cluster of the M clusters is a function of a predefined load current demand from each load of the multiple loads.

In one embodiment, the preprogrammed configuration of the fuse harness is designed to meet the predefined load current demand from at least one load of the multiple loads by combining two or more EFn_i.

In one embodiment, the controller circuit is further programmed to, upon the expiration of the preprogrammed duration of time: categorize each EFn as derated responsive to determining that EFn_i exceeded the preprogrammed load current expectation for EFn but was than a critical current threshold for EFn, while the EFn_T was within the preprogrammed temperature threshold.

In one embodiment, the controller circuit is further programmed to, upon the expiration of the preprogrammed duration of time: categorize each EFn as failed responsive to determining that the EFn_T exceeded the preprogrammed temperature threshold.

The system of claim 1, wherein the controller circuit is further programmed to, upon the expiration of the preprogrammed duration of time: categorize each EFn as failed responsive to determining that EFn_i exceeded a critical current threshold for EFn.

In one embodiment, the load current alert is a system alert for the vehicle.

Also provided is a method for reallocation of electronic fuses (EF) within an EF array comprising a plurality (N) of electronic fuses (EFn), implemented onboard a vehicle, the method including: at a controller circuit comprising a processor programmed with programming instructions, concurrently receiving, for each EFn, a respective load current (EFn_i) and temperature (EFn_T); comparing, for each EFn, the respective EFn_i to an operating range for the EFn; turning off each EFn for which the EFn_i is not within the operating range, and generating a respective load current alert responsive thereto; wherein a preprogrammed configuration of a fuse harness defines multiple (M) clusters, determining, for each EFn_i that is within the operating range, whether the respective EFn is a member of a cluster of the M clusters; identifying other members of the cluster, responsive to determining that EFn is the member of the cluster; for each member of the cluster, for a preprogrammed duration of time, performing comparisons of the respective EFn_i to a preprogrammed load current expectation, and of the respective EFn_T to a preprogrammed temperature threshold; upon an expiration of the preprogrammed duration of time, categorizing each EFn in the cluster as either healthy, derated, or failed, as a function of the EFn_i and the EFn_T comparisons; generating, for each EFn categorized as derated, a derated alert for the EFn; and identifying another member of cluster as a target EF having a reallocation potential that is consistent with the preprogrammed configuration of the fuse harness, for each EFn that is categorized as failed, and modifying fuse limits of the target EF in accordance with the reallocation potential.

In an embodiment, the reallocation potential includes a capacity to support an increased load current, and further comprising, modifying the fuse limits of the target EF by increasing the load current of the target EF.

In an embodiment, further comprising, after modifying the fuse limits of the target EF, turning off the respective EFn that is categorized as failed, and generating an alert indicating that the cluster has been modified.

In an embodiment, further comprising, referencing preprogrammed EF data, for each EFn, to determine the preprogrammed load current expectation.

In an embodiment, the preprogrammed configuration of the fuse harness specifies an arrangement and location of each cluster of the M clusters, and the arrangement and location of each cluster of the M clusters is a function of a predefined load current demand from each load of multiple loads.

In an embodiment, wherein the preprogrammed configuration of the fuse harness is designed to meet the predefined load current demand from at least one load of the multiple loads by combining two or more EFn_i.

In an embodiment, further comprising, upon the expiration of the preprogrammed duration of time: categorizing each EFn as derated responsive to determining that EFn_i exceeded the preprogrammed load current expectation for EFn but was than a critical current threshold for EFn, while the EFn_T was within the preprogrammed temperature threshold.

In an embodiment, further comprising, upon the expiration of the preprogrammed duration of time: categorizing each EFn as failed responsive to determining that the EFn_T exceeded the preprogrammed temperature threshold.

In an embodiment, further comprising, upon the expiration of the preprogrammed duration of time: categorizing each EFn as failed responsive to determining that EFn_i exceeded a critical current threshold for EFn.

Also provided is a system for reallocation of electronic fuses (EF) in an EF array configured to drive a fuse harness operationally coupled to multiple loads, implemented onboard a vehicle. The system including: a fuse communication module in operable communication with the EF array comprising a plurality (N) of electronic fuses, each individually referred to as an EFn, the fuse communication module configured to concurrently receive and cache, for each EFn, a respective load current (EFn_i) and temperature (EFn_T); a current limit checker module coupled to the fuse communication module and configured to: compare, for each EFn, the respective EFn_i to an operating range for the EFn; and turn off each EFn for which the EFn_i is not within the operating range, and generate a respective load current alert; a cluster member determiner module coupled to the current limit checker module and configured to: wherein a preprogrammed configuration of the fuse harness defines multiple (M) clusters, determine, for each EFn_i that is within the operating range, whether the respective EFn is a member of a cluster of the M clusters; and identify other members of the cluster, responsive to determining that EFn is the member of the cluster; and a health determiner module coupled to the cluster member determiner module and configured to: for each member of the cluster, for a preprogrammed duration of time, perform comparisons of the respective EFn_i to a preprogrammed load current expectation, and of the respective EFn_T to a preprogrammed temperature threshold; upon an expiration of the preprogrammed duration of time, categorize each EFn in the cluster as either healthy, derated, or failed, as a function of the EFn_i and the EFn_T comparisons; and generate, for each EFn categorized as derated, a derated alert for the EFn; and a fuse reallocation module coupled to the health determiner module and configured to: for each EFn that is categorized as failed, identify another member of cluster as a target EF having a reallocation potential that is consistent with the preprogrammed configuration of the fuse harness; and modify fuse limits of the target EF in accordance with the reallocation potential.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
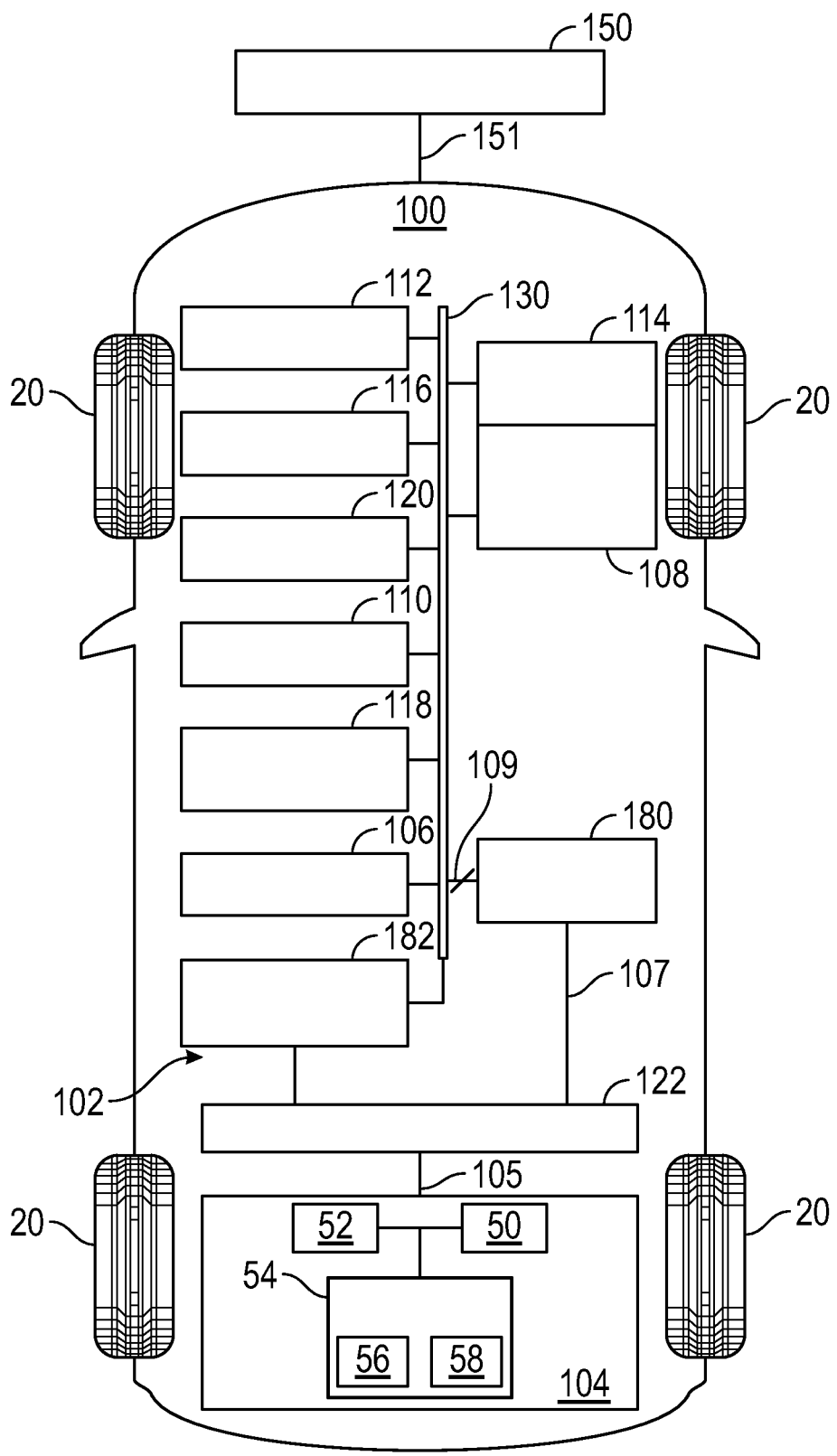
FIGS. 1-2 are schematic diagrams illustrating a system for reallocation of electronic fuses (EF) configured to drive a fuse harness operationally coupled to multiple loads implemented onboard a vehicle, in accordance with various embodiments.

The following detailed description is merely exemplary in nature and is not intended to limit the application and uses. Furthermore, there is no intention to be bound by any expressed or implied theory presented in the preceding technical field, background, summary, or the following detailed description.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices.

As used herein, the term "module" may refer to any hardware, software, firmware, electronic control component, processing logic, and/or processor device, individually or in any combination. In various embodiments, a module is one or more of: an application specific integrated circuit (ASIC), a field-programmable gate-array (FPGA), an electronic circuit, a computer system comprising a processor (shared, dedicated, or group) and memory that executes one or more software or firmware programs, a combinational logic circuit, and/or other suitable components that provide the functionality attributed to the module.

For the sake of brevity, conventional techniques related to signal processing, data transmission, signaling, control, machine learning models, radar, lidar, image analysis, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

As mentioned, smart electronic fuses (EF) are sometimes used to meet load current demands in vehicle applications. However, a technical problem is presented in that each model and variation of a vehicle may have its own arrangement of loads, each load having its own load current demand, resulting in a lack of interchangeability. Reconfiguring an array of smart EFs for each new iteration of a vehicle is cumbersome and inefficient.

Exemplary embodiments provide a technological solution to this problem with systems and methods for reallocation of electronic fuses (EF) configured to drive a fuse harness operationally coupled to multiple loads implemented onboard a vehicle. Embodiments leverage a preprogrammed fuse harness configuration and use a connection scheme to match it with an EF array. Embodiments provide control and monitoring functionality to dynamically reallocate EFs responsive to detected failed EFs and detected derated EFs.

Embodiments provide a configurable solid-state smart fuse solution to create a flexible energy distribution strategy. Embodiments provide a single connection system that utilizes a calibratable EF array and fuse harness to configure fuse allocation based on vehicle architecture and requirements of loads.

The provided system employs a controller circuit that controls EF parameters and their channels, such that the controller circuit can reconfigure fuse allocation based on vehicle architecture requirements of loads and can dynamically reallocate the EFs. As is described in more detail below, embodiments advantageously support system optimization in the following scenarios: components/wiring faults, load prioritization (power demand), and vehicle operating modes, in addition to easily providing a redundant power path in the event of a fault/failed EF.

FIG. 1 is a functional block diagram depicting an example mobile platform. The example mobile platform is a vehicle 100 that is capable of movement, towing and carrying passengers from one location to another. The vehicle 100 is depicted in the illustrated embodiment as a passenger car, but other vehicle types, including motorcycles, taxi cabs, vehicle fleets, buses, sedans, wagons, trucks, sport utility vehicles, other automobiles, recreational vehicles (RVs), locomotives, and other vehicles may also be used. As is generally understood, the vehicle 100 may embody a body, chassis, and wheels 20, each of which are rotationally coupled to the chassis near a respective corner of the body. The vehicle 100 is depicted with four wheels 20, but the number of wheels 20 may vary in other embodiments. The vehicle 100 may be autonomous or semi-autonomous. The vehicle 100 includes at least a battery management system 182 and a collective functional block, drive systems 106, which generally includes known vehicle systems for vehicle operation, such as, a propulsion system, a transmission system, a steering system, actuators for the wheels, and a brake system, and generates a variety of signals, including vehicle speed and vehicle acceleration. In various embodiments, the battery management system 182 and drive systems 106 are operationally coupled to one or more onboard components and systems via a communication bus 130. The battery management system 182 is understood to include a battery and provide power to the system for reallocation of electronic fuses (EF) configured to drive a fuse harness 180.

External sources 150 includes one or more other mobile platforms (also referred to herein as "road actors") that are external to the vehicle 100, in the environment surrounding the vehicle 100.

A system for reallocation of electronic fuses (EF) configured to drive a fuse harness 180 operationally coupled to multiple loads, shown generally as system 102, includes a Controller Circuit 104 (also referred to as a smart electronic controller, SEC) and an electronic fuse array 122. In various embodiments, the system 102 distributes power to other modules onboard the vehicle 100. In various embodiments, the Controller Circuit 104 is communicatively coupled to onboard systems and components via the communication bus 130. The Controller Circuit 104 may transmit commands, controls, and power for various onboard systems and components via the communication bus 130. The Controller Circuit 104 may obtain information from and about various road actors via onboard camera system 118 and sensors, and/or via a transceiver 112.

Returning to the vehicle 100, the vehicle 100 may include one or more other components and/or onboard systems that may each communicate with the Controller Circuit 104, generally via the communication bus 130. Non-limiting examples of the onboard components include the drive systems 106, the battery management system 182, a central platform controller 108, user interface 114, the transceiver 112, a global positioning system (GPS) 116, the camera system 118 and sensors, a mapping system 110, a navigation system 120, and a fuse harness 180. The functions and operations of each of these components are described in more detail below.

In various embodiments, the central platform controller 108 may receive and integrate communications from a variety of modules and systems known to be present in the above-described vehicle 100. Accordingly, in some embodiments, the inputs provided by the central platform controller 108 to the Controller Circuit 104 may include or represent user inputs (including ALC requests), mobile applications and systems inputs, inputs from off-board communications (e.g., via the transceiver 112), and inputs that are based on the global positioning system (GPS 116), navigation system 120, mapping system 110, camera system 118 and sensors, and drive systems 106.

The user interface 114 may provide any combination of touch, voice/audio, cursor, button press and gesture control for a passenger in the vehicle 100. Accordingly, the user interface 114 may include a display device and an audio device, as is known in the industry.

The transceiver 112 may be configured to enable communication between onboard components and systems and various external sources 150, such as cloud server systems. Accordingly, in various embodiments, the transceiver 112 includes the hardware and software to support one or more communication protocols for wireless communication 151 (e.g., Wi-Fi and Bluetooth) between the Controller Circuit 104 and external sources, such as routers, internet, the cloud, satellites, communication towers and ground stations.

GPS 116 is a global positioning system as is known in the mobile platform industry. GPS 116 may interact via the transceiver 112 and various external sources to provide information about a location in three-dimensional space of the vehicle at any given time.

Mapping system 110, when present on the vehicle 100, includes a database for storing up to date and high-resolution maps of streets, environmental features, and the like.

Navigation system 120 may obtain and process signals from various onboard components to make determinations about current location, trajectory, speed, acceleration, etc., as well as coordinate with the central platform controller 108, GPS 116, and mapping system 110 to plan a future location, trajectory, speed, acceleration, turns, and the like.

The camera system 118 and sensors may include one or more cameras and sensors for detecting location and movement of road actors and features surrounding the vehicle. The sensors in the camera system 118 and sensors may be configured to transmit, receive, and process lidar, radar, or other signals to make determinations about location and movement of nearby road actors.

In various embodiments, as shown in FIG. 1, the Controller Circuit 104 is realized as an enhanced computer system, comprising computer readable storage device or media, memory 54, for storage of instructions, algorithms, and/or programs 56, such as an EF allocation algorithm and operating parameters 58, such as, preprogrammed EF data (for each EFn in the EF array) including preprogrammed load current thresholds, critical current thresholds (fuse limits), voltage thresholds, and temperature thresholds, and a preprogrammed fuse harness 180 configuration. The Controller Circuit 104 also includes a processor 50 to execute the program 56, and an input/output interface (I/O) 52. The computer readable storage device or media, memory 54, may include volatile and nonvolatile storage in read-only memory (ROM), random-access memory (RAM), and keep-alive memory (KAM), for example. KAM is a persistent or non-volatile memory that may be used to store various operating variables while the processor 50 is powered down. The memory 54 may be implemented using any of several known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the processor 50 in controlling the vehicle 100. In various embodiments, processor 50 is configured to implement the system 102. The memory 54 may also be utilized by the processor 50 to cache data, to temporarily store results of comparisons and analyses, and the like. Information in the memory 54 may be organized and/or imported from an external source during an initialization or installment operation in a method; it may also be programmed via a user I/O interface.

The input/output interface (I/O) 52 may be operationally coupled to the processor 50 via a bus and enables intra-circuit 104 communication as well as extra-circuit 104 communication. The input/output interface (I/O) 52 may include one or more wired and/or wireless network interfaces and can be implemented using any suitable method and apparatus. In various embodiments, the input/output interface (I/O) 52 includes the hardware and software to support one or more communication protocols for wireless communication between the processor 50 and external sources, such as satellites, the cloud, communication towers and ground stations. In various embodiments, the input/output interface (I/O) 52 supports communication with technicians, and/or one or more storage interfaces for direct connection to storage apparatuses.

During operation of the system 102, the processor 50 loads and executes one or more algorithms, instructions, and rules embodied as program 56, and, as such, controls the general operation of the system 102. During operation of the system 102, the processor 50 may receive data from the communication bus 130 or external sources. In various embodiments of the system 102, the Controller Circuit 104 may: perform operations attributed to the system 102 in accordance with an algorithm; perform operations in accordance with state machine logic; and perform operations in accordance with logic in a programmable logic array.

While the exemplary embodiment of the system 102 is described in the context of the Controller Circuit 104 implemented as a fully functioning enhanced computer system, those skilled in the art will recognize that the mechanisms of the present disclosure are capable of being distributed as a program product including program 56 and predefined parameters. Such a program product may comprise an arrangement of instructions organized as multiple interdependent program code modules, each configured to achieve a separate process and/or perform a separate algorithmic operation, arranged to manage data flow through the system 102. The program code modules may each comprise an ordered listing of executable instructions for implementing logical functions for the processes performed by the system 102. The instructions in the program code modules, when executed by a processor (e.g., processor 50), cause the processor to receive and process signals, and perform logic, calculations, methods and/or algorithms as described herein for automatically and in real-time performing vehicle-target localization and generating associated commands.

Once developed, the program code modules constituting a program product may be stored and distributed individually, or together, using one or more types of non-transitory computer-readable signal bearing media may be used to store and distribute the instructions, such as a non-transitory computer readable medium. Such a program product may take a variety of forms, and the present disclosure applies equally regardless of the type of computer-readable signal bearing media used to carry out the distribution. Examples of signal bearing media include recordable media such as floppy disks, hard drives, memory cards and optical disks, and transmission media such as digital and analog communication links. It will be appreciated that cloud-based storage and/or other techniques may also be utilized as memory and as program product time-based viewing of clearance requests in certain embodiments.

The fuse harness 180 interfaces the plurality of electronic fuses (EF) with multiple loads onboard the vehicle and thereby assists the system 102 with distribution of power. With respect to the present invention, and as will be described in more detail below, in various embodiments, some or all of the components and systems coupled to the communication bus 130 may be considered one of the multiple loads that are operationally coupled to the fuse harness 180. Additionally, in various embodiments, the "loads" could also be a "source" as well, e.g. generator or APM module that is sourcing power onto an electric power bus within the communication bus 130.

Figure 2:
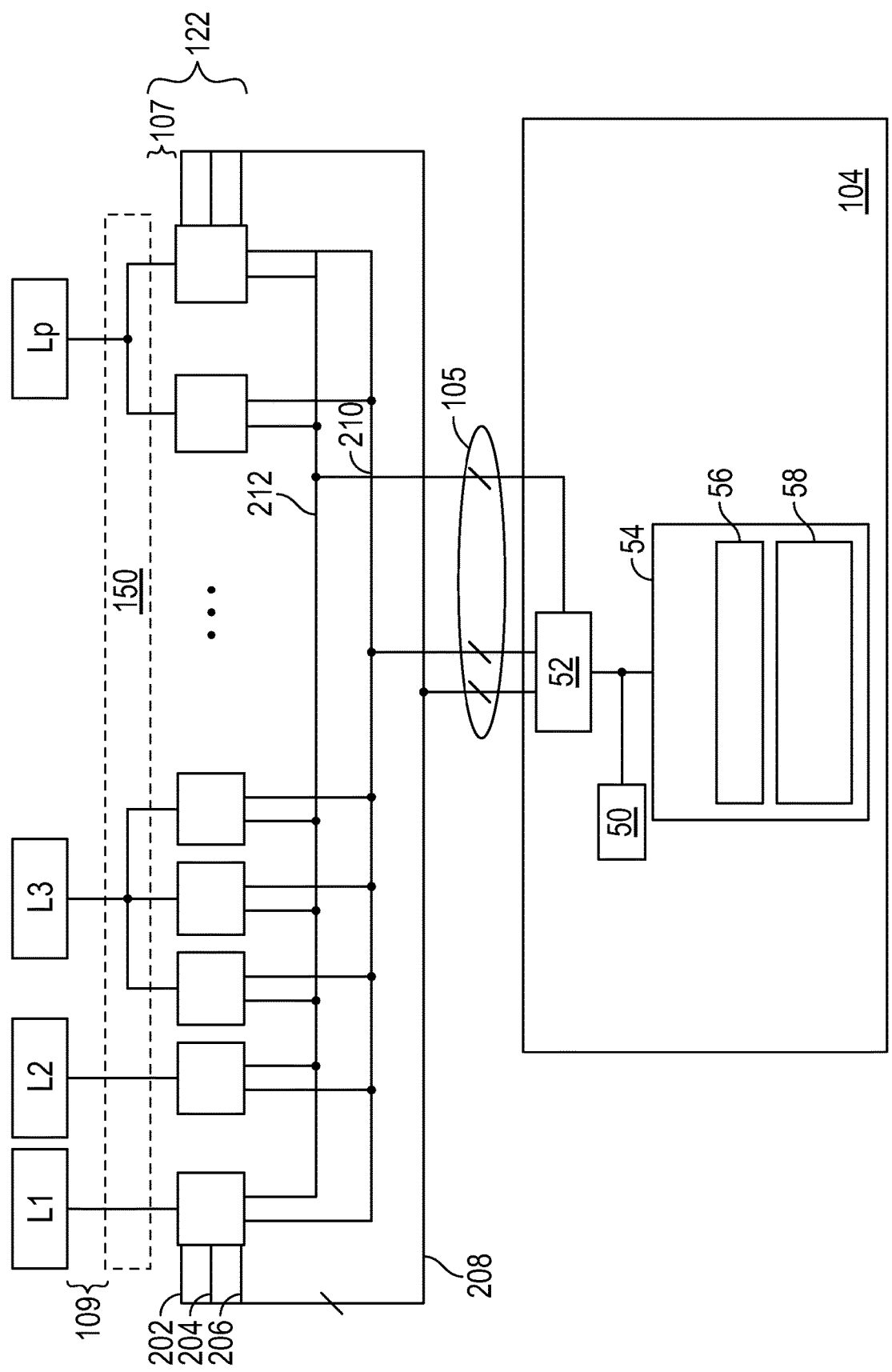

FIG. 2 illustrates the concepts of the EF array 122, clusters, and loads, as used herein. The EF array 122 is an arrangement or grouping of electronic fuses. The EF array 122 comprises N electronic fuses EFn, such that n ranges from 1 to N (depicted as EF1, EF2, EF3 . . . EFN). Each EFn has its own dedicated voltage output 202 (EFn_v to EFN_v), temperature output 206 (EFn_T to EFN_T) and load current output 204 (EFn_i to EFN_i). Each EFn also has a control input (Ctrl1 to CtrlN) for controlling its operating parameters, and its own on/off control that is used to control load current through its channel (on/off1 to on/offN). With regard to the operating parameters, which are stored in memory 54, each EFn has a programmable threshold for its current limit vs. time to emulate legacy fuses (i.e., slow burn and/or fast burn fuses). A sensor bus 208 combines all the voltage, temperature, and current outputs. The bus 105 that operably couples the controller circuit 104 to the EF array 122 is a combination of a control bus 210 an on/off bus 212, a power bus, and the sensor bus 208. The controller circuit 104 continuously runs diagnostics/prognostics on the load current drawn from each EFn and assesses overall system 102 health based on the system 102 capacity to meet its fuse limits for each EFn.

In the example, multiple (P) loads (L) are depicted as L1, L2, L3, . . . LP (individually, each load is Lp, as p ranges from 1 to P). Each load Lp may have a different load current demand. A preprogrammed configuration of the fuse harness 180 achieves, concurrently, the predefined load current demands 109 of the multiple loads.

The preprogrammed configuration of the fuse harness 180 is designed to meet the predefined load current demand from at least one load of the multiple loads by combining two or more EFn_i, via a cluster. The preprogrammed configuration of the fuse harness 180 defines multiple (M) clusters (individually, each cluster is cluster_m, as m ranges from 1 to M). The preprogrammed configuration of the fuse harness 180 specifies an arrangement and spatial location of each cluster of the M clusters, the arrangement and location of each cluster of the M clusters is a function of a predefined load current demand from each load of the multiple (P) loads (L).

Each cluster_m serves to add load current outputs from electronic fuses in the EF array. The individual electronic fuses that are joined in a cluster_m are called cluster members, or members of cluster_m.

In the non-limiting example of FIG. 2, the preprogrammed configuration of the fuse harness 180 defines the following: EF1 is solely connected to L1, EF2 is solely connected to L2, a cluster_1 combines load current outputs from EF3, EF4, and EF5 to supply the load current demands of L3, and a cluster_M combines load current outputs from EFN−1 and EFN to supply the load current demands of LP.

As FIGS. 1-2 illustrate, the fuse harness 180 is preprogrammed or pre-configured to meet the power and load current demands 109 of the multiple loads. Embodiments of the present system 102 leverage information related to the programming of the fuse harness 180 to dynamically adapt the load current output 107 and power of the EF array 122, to enable a more robust fuse harness 180 operation, a more robust provision of necessary current to loads onboard the vehicle, and overall improved energy management strategy for the vehicle.

Figure 3:
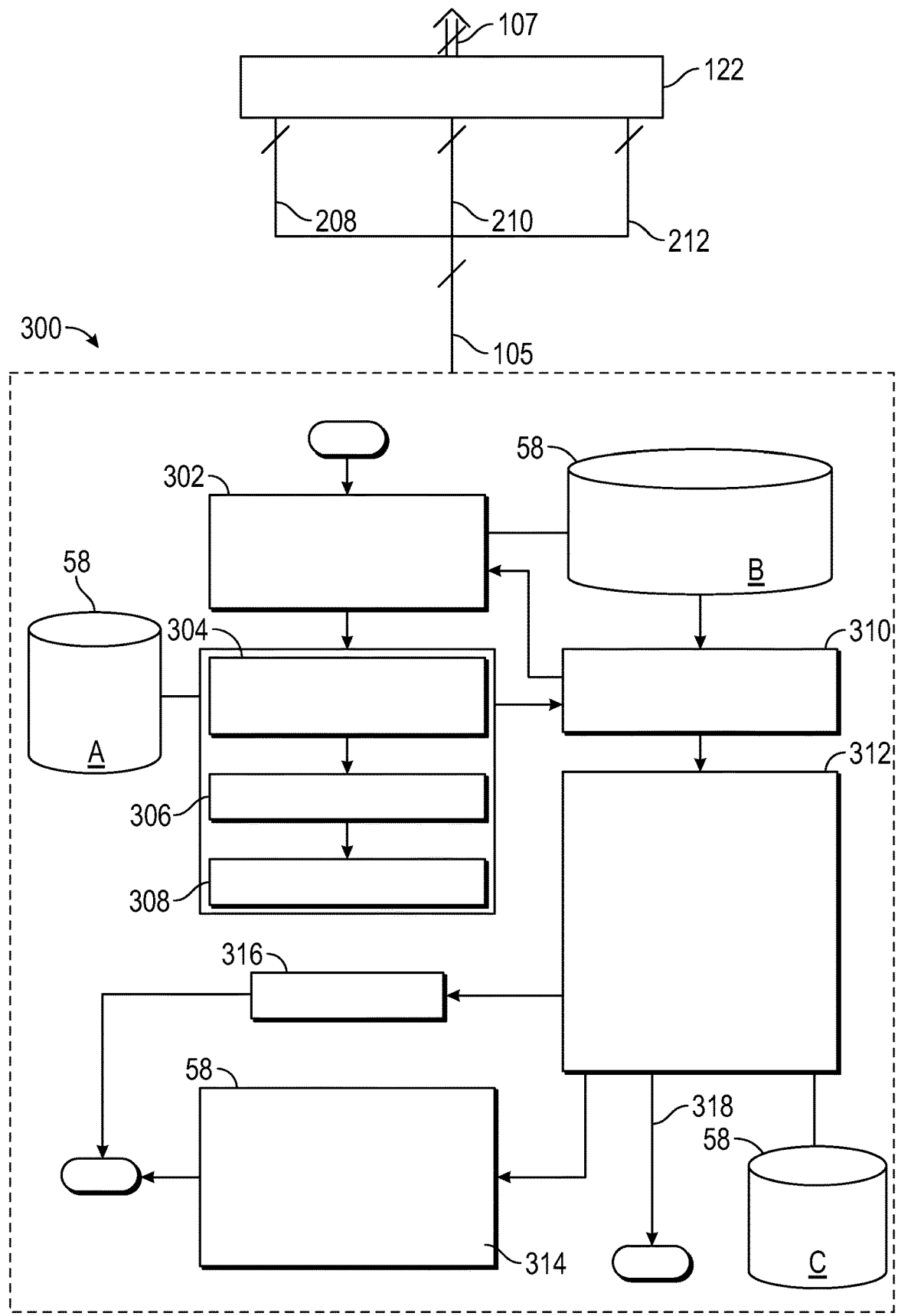
FIG. 3. is an architectural block diagram of one or more application modules that may be operating in the system for reallocation of electronic fuses (EF) configured to drive a fuse harness operationally coupled to multiple loads implemented onboard a vehicle, in accordance with various embodiments.
Figure 4:
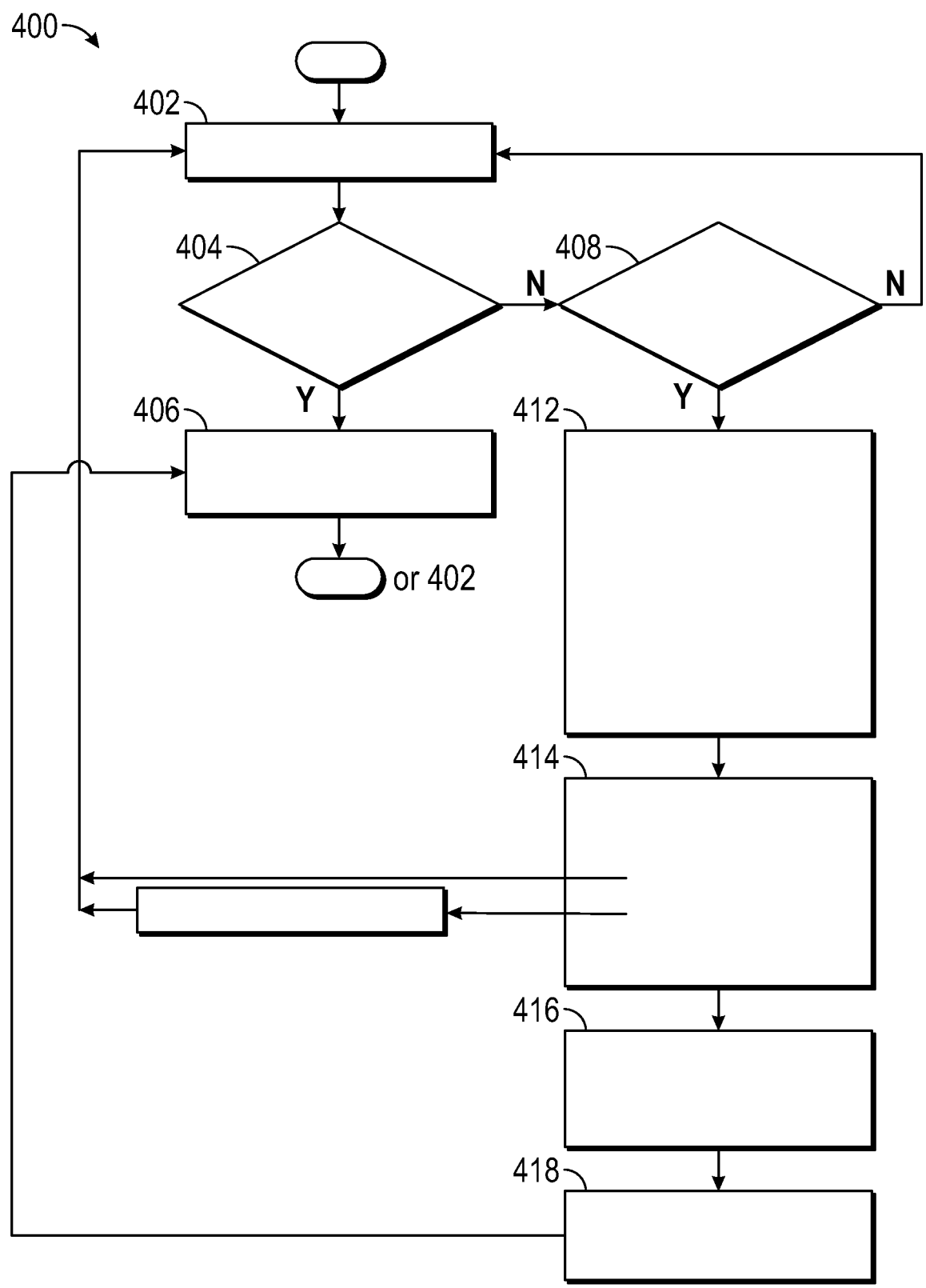
FIG. 4 provides a process flow chart depicting an example method for reallocation of electronic fuses (EF) configured to drive a fuse harness operationally coupled to multiple loads implemented onboard a vehicle, in accordance with various embodiments.

Turning now to FIGS. 3-4, and with continued reference to FIGS. 1-2, various method steps and associated exemplary application process modules of the system 102 are described. FIG. 3 is an architectural block diagram 300 of one or more application modules that may be operating in the system 102, and is used in conjunction with FIG. 4, illustrating steps of a method for smoothing automated lane change operations, shown generally as method 400.

In an application, each module may be realized as one or more sub-modules, and the modules and sub-modules may be distributed among and between various onboard systems and components. In various examples, the program 56 and stored variables and pre-loaded custom data 58 embody the application process modules of the system 102.

For illustrative purposes, the following description of method 400 may refer to elements mentioned above in connection with FIGS. 1-3. In various embodiments, portions of method 400 may be performed by different components of the described system 102. It should be appreciated that method 400 may include any number of additional or alternative operations and tasks, the tasks shown in FIGS. 3-4 need not be performed in the illustrated order, and method 400 may be incorporated into a more comprehensive procedure or method, such as an energy saving or safety application, having additional functionality not described in detail herein. Moreover, one or more of the tasks shown in FIGS. 3-4 could be omitted from an embodiment of the method 400 if the intended overall functionality remains intact.

A fuse communication module 302 may manage the tasks of concurrently receiving sensor data from the sensor bus 208 and caching it. This is represented at 402, by the task of receiving and caching, for each EFn of the EF array, a respective load current (EFn_i) and temperature (EFn_T).

A current limit checker module 304 may manage the tasks of comparing, for each EFn, the respective EFn_i to an operating range load current for the EFn to determine whether the EFn_i exceeds the operating range of the load current (at 404). The current limit checker module 304 may perform channel control 306, which includes turning off each EFn for which the EFn_i is not within the operating range. As used herein, turning off (at 406) is equivalent to sending an "off" signal, blowing the fuse, and opening the gate in a MOSFET device so that no load current can flow through that EF. In various embodiments, responsive to turning off the EFn at 406, the current limit checker module 304 may perform the task 308 of generating a respective load current alert. In various embodiments, the load current alert may be a system alert, and may be placed on the communication bus 130 for use by other vehicle systems, such as the central platform controller 108. After 406, the system 102 may return to 402 or end.

A cluster member determiner module 310 may reference a pre-loaded harness arrangement to perform the tasks of determining (at 408), for each EFn_i that is within the operating range, whether the respective EFn is a member of a cluster_m of M clusters defined in a preprogrammed configuration of the fuse harness. At 410 the cluster member determiner module 310 may perform the task of identifying all other members of cluster_m, responsive to determining that EFn that is a member of a cluster_m.

An EF health determiner module 312 may perform monitoring and categorizing tasks for cluster members. For example, for of all members of cluster_m, for a preprogrammed duration of time, the EF health determiner module 312 may monitor EFn_i and perform comparisons (at 412) of EFn_i to a preprogrammed load current expectation, and of EFn_T to a preprogrammed temperature threshold. Upon the expiration of the preprogrammed duration of time, at 414, EF health determiner module 312 may categorize each EFn of all members of cluster_m as either healthy, derated, or failed, as a function of the EFn_i and EFn_T comparisons. The EF health determiner module 312 may generate, for each EFn categorized as derated, a derated alert for the EFn. In various embodiments, the derated alert may be a system alert, and may be placed on the communication bus 130 for use by other vehicle systems, such as the central platform controller 108.

And finally, a fuse reallocation module 314 may perform the tasks of, for each EFn that is categorized as failed, at 416, identify a target EF among the other members of cluster_m as having a reallocation potential that is consistent with the preprogrammed configuration of the fuse harness 180; and, at 418, modify fuse limits of the target EF in accordance with the reallocation potential. After 418, the system 102 may move to 406 and turn off the channel of the failed EFn.

The reallocation potential includes a capacity for a given EFn to support an increased load current, and the controller circuit 104 is further programmed to modify the fuse limits of the target EF by increasing the load current of the target EF accordingly.

To illustrate the above, the following non-limiting example is provided: three EFs (EF1, EF2, and EF3) are in a cluster_m to meet a load requirement of 24 Amps load current for L1. Each EF can handle 12 Amps but is currently set to 8 Amps. The system 102 determines that one of the fuses, EF1, is failed, via the methodology described above. The system 102 analyzes the reallocation potential of EF2 and EF3 responsive to categorizing EF1 as failed. The reallocation potential of EF2 and EF3 allows for each to have its fuse limit raised (via a respective control signal on control bus 210) to 12 Amps, this continues to meet the load requirement of 24 Amps load current. This is referred to as a reallocation of the load current to EF2 and EF3 for L1. While this example provided two target EFs in the cluster_m that were identified and modified, one with skill in the art will appreciate that this concept adapts to other combinations of cluster members.

The system 102 may also, from 418, move to 402 and turn off the channel for EF1 and generate a system command/alert indicating that the load L1 attached to this cluster_m is now limited to the new current limit from EF2 and EF3 (i.e., that cluster_m has been modified).

Returning to the EF health determiner module 312, the derated category is now described. Upon expiration of the preprogrammed duration of time, the EF health determiner module 312 may categorize each EFn as derated responsive to determining that EFn_i exceeded the preprogrammed current load expectation for EFn but was than a critical current threshold for EFn, while the EFn_T was within the preprogrammed temperature threshold.

To illustrate the above, the following non-limiting example of the derated category is now provided. Returning to the cluster_m described above, consider a scenario in which EF1 has not yet failed, but the system 102 detects that, instead of EF1, EF2, and EF3 each providing roughly 33% of the load requirement of 24 Amps load current for L1 (the current usage profile), in accordance with the preprogrammed configuration of the fuse harness 180, EF1 and EF2 are providing 80% of the load requirement of 24 Amps, and the temperature of EF1 (EF1_T) is within the temperature threshold for EF1. This is an example of a derated state for EF1.

Responsive to the detected derated state of EF1, the system 102 continues to monitor EF1_i and EF1_T. At some point in time, such as, during the preprogrammed duration of time, it is likely that either EF1_T will exceed the temp threshold or the current usage profile of the cluster_m gets worse; responsive to either, the system 102 determines that EF1 has entered a failed state and EF1 is not functioning correctly. Responsive to this determination, the system 102 may move to step 414, described above, and may dynamically modify one or more target EFs in the EF array.

Enabling the dynamic modification of EFs and the ability to turn them off is referred to as fuse reallocation. The fuse reallocation capability provided by these embodiments supports designs with precise power/fuse response during transient conditions and supports load shedding to minimize impact of any fuse allocation, thereby enabling a flexible energy distribution strategy for a solid-state smart EF solution. The fuse reallocation capacity provided by these embodiments also enables incorporating redundancy in power lines so that safety critical loads can be powered without interruption and without derating based on a fault in one or two lines. Embodiments also streamline applications by enabling the elimination of additional controllers required.

Having described the system 102, it may be appreciated that in various embodiments, there could be 1 or more controller circuits 104 (also referred to as smart electronic controllers (SEC)) connected to the same battery source in the battery management system 182, with each of them connected to different loads in the vehicle—this could happen when there are more loads in the systems onboard the vehicle 100 then available outputs from the Controller Circuit 104 itself. Eg. the vehicle needs 50 clusters that would comprise of 150 individual eFuses and each Controller Circuit 104 or SEC has 100 eFuses. In this case, two Controller Circuit 104 or SECs would be needed to cover the electrical systems of the vehicle 100.

Thus, the provided system 102 and method for reallocation of electronic fuses (EF) configured to drive a fuse harness operationally coupled to multiple loads, implemented onboard a vehicle provides a technological solution to the technical problems of available systems reliant on multiple smart EFs.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. Various changes can be made in the function and arrangement of elements without departing from the scope of the disclosure as set forth in the appended claims and the legal equivalents thereof.

What is claimed is:

1. A system for reallocation of electronic fuses (EF) configured to drive a fuse harness operationally coupled to multiple loads, implemented onboard a vehicle, the system comprising:
   an EF array comprising a plurality (N) of electronic fuses (EFn);
   a controller circuit comprising a processor operationally coupled to the EF array, and programmed to,
      concurrently receive, for each EFn, a respective load current (EFn_i) and temperature (EFn_T);
      compare, for each EFn, the respective EFn_i to an operating range for the EFn;
      turn off each EFn for which the EFn_i is not within the operating range, and generate a respective load current alert responsive thereto;
      wherein a preprogrammed configuration of the fuse harness defines multiple (M) clusters,
      determine, for each EFn_i that is within the operating range, whether the respective EFn is a member of a cluster of the M clusters;
      identify other members of the cluster, responsive to determining that EFn is the member of the cluster;
      for each member of the cluster, for a preprogrammed duration of time, perform comparisons of the respective EFn_i to a preprogrammed load current expectation, and of the respective EFn_T to a preprogrammed temperature threshold;

upon an expiration of the preprogrammed duration of time, categorize each EFn in the cluster as either healthy, derated, or failed, as a function of the EFn_i and the EFn_T comparisons;

generate, for each EFn categorized as derated, a derated alert for the EFn; and for each EFn that is categorized as failed, identify another member of cluster as a target EF having a reallocation potential that is consistent with the preprogrammed configuration of the fuse harness; and modify fuse limits of the target EF in accordance with the reallocation potential.

2. The system of claim 1, wherein the reallocation potential includes a capacity to support an increased load current, and the controller circuit is further programmed to modify the fuse limits of the target EF by increasing the load current of the target EF.

3. The system of claim 2, wherein the controller circuit is further programmed to, after modifying the fuse limits of the target EF, turn off the respective EFn that is categorized as failed, and generate an alert indicating that the cluster has been modified.

4. The system of claim 1, wherein the controller circuit is further programmed to: reference preprogrammed EF data, for each EFn, to determine the preprogrammed load current expectation.

5. The system of claim 1, wherein the preprogrammed configuration of the fuse harness specifies an arrangement and location of each cluster of the M clusters, and the arrangement and location of each cluster of the M clusters is a function of a predefined load current demand from each load of the multiple loads.

6. The system of claim 5, wherein the preprogrammed configuration of the fuse harness is designed to meet the predefined load current demand from at least one load of the multiple loads by combining two or more EFn_i.

7. The system of claim 1, wherein the controller circuit is further programmed to, upon the expiration of the preprogrammed duration of time:

categorize each EFn as derated responsive to determining that EFn_i exceeded the preprogrammed load current expectation for EFn but was than a critical current threshold for EFn, while the EFn_T was within the preprogrammed temperature threshold.

8. The system of claim 1, wherein the controller circuit is further programmed to, upon the expiration of the preprogrammed duration of time:

categorize each EFn as failed responsive to determining that the EFn_T exceeded the preprogrammed temperature threshold.

9. The system of claim 1, wherein the controller circuit is further programmed to, upon the expiration of the preprogrammed duration of time:

categorize each EFn as failed responsive to determining that EFn_i exceeded a critical current threshold for EFn.

10. The system of claim 1, wherein the load current alert is a system alert for the vehicle.

11. A method for reallocation of electronic fuses (EF) within an EF array comprising a plurality (N) of electronic fuses (EFn), implemented onboard a vehicle, the method comprising: at a controller circuit comprising a processor programmed with programming instructions, concurrently receiving, for each EFn, a respective load current (EFn_i) and temperature (EFn_T);

comparing, for each EFn, the respective EFn_i to an operating range for the EFn;

turning off each EFn for which the EFn_i is not within the operating range, and generating a respective load current alert responsive thereto;

wherein a preprogrammed configuration of a fuse harness defines multiple (M) clusters, determining, for each EFn_i that is within the operating range, whether the respective EFn is a member of a cluster of the M clusters;

identifying other members of the cluster, responsive to determining that EFn is the member of the cluster;

for each member of the cluster, for a preprogrammed duration of time, performing comparisons of the respective EFn_i to a preprogrammed load current expectation, and of the respective EFn_T to a preprogrammed temperature threshold;

upon an expiration of the preprogrammed duration of time, categorizing each EFn in the cluster as either healthy, derated, or failed, as a function of the EFn_i and the EFn_T comparisons;

generating, for each EFn categorized as derated, a derated alert for the EFn; and identifying another member of cluster as a target EF having a reallocation potential that is consistent with the preprogrammed configuration of the fuse harness, for each EFn that is categorized as failed, and modifying fuse limits of the target EF in accordance with the reallocation potential.

12. The method of claim 11, wherein the reallocation potential includes a capacity to support an increased load current, and further comprising, modifying the fuse limits of the target EF by increasing the load current of the target EF.

13. The method of claim 12, further comprising, after modifying the fuse limits of the target EF, turning off the respective EFn that is categorized as failed, and generating an alert indicating that the cluster has been modified.

14. The method of claim 11, further comprising, referencing preprogrammed EF data, for each EFn, to determine the preprogrammed load current expectation.

15. The method of claim 11, wherein the preprogrammed configuration of the fuse harness specifies an arrangement and location of each cluster of the M clusters, and the arrangement and location of each cluster of the M clusters is a function of a predefined load current demand from each load of multiple loads.

16. The method of claim 15, wherein the preprogrammed configuration of the fuse harness is designed to meet the predefined load current demand from at least one load of the multiple loads by combining two or more EFn_i.

17. The method of claim 11, further comprising, upon the expiration of the preprogrammed duration of time:

categorizing each EFn as derated responsive to determining that EFn_i exceeded the preprogrammed load current expectation for EFn but was than a critical current threshold for EFn, while the EFn_T was within the preprogrammed temperature threshold.

18. The method of claim 11, further comprising, upon the expiration of the preprogrammed duration of time:

categorizing each EFn as failed responsive to determining that the EFn_T exceeded the preprogrammed temperature threshold.

19. The method of claim 11, further comprising, upon the expiration of the preprogrammed duration of time:

categorizing each EFn as failed responsive to determining that EFn_i exceeded a critical current threshold for EFn.

20. A system for reallocation of electronic fuses (EF) in an EF array configured to drive a fuse harness operationally coupled to multiple loads, implemented onboard a vehicle, the system comprising:
  a fuse communication module in operable communication with the EF array comprising a plurality (N) of electronic fuses, each individually referred to as an EFn, the fuse communication module configured to concurrently receive and cache, for each EFn, a respective load current (EFn_i) and temperature (EFn_T);
  a current limit checker module coupled to the fuse communication module and configured to:
    compare, for each EFn, the respective EFn_i to an operating range for the EFn; and
    turn off each EFn for which the EFn_i is not within the operating range, and generate a respective load current alert;
  a cluster member determiner module coupled to the current limit checker module and configured to:
    wherein a preprogrammed configuration of the fuse harness defines multiple (M) clusters,
    determine, for each EFn_i that is within the operating range, whether the respective EFn is a member of a cluster of the M clusters; and
    identify other members of the cluster, responsive to determining that EFn is the member of the cluster; and
  a health determiner module coupled to the cluster member determiner module and configured to:
    for each member of the cluster, for a preprogrammed duration of time, perform comparisons of the respective EFn_i to a preprogrammed load current expectation, and of the respective EFn_T to a preprogrammed temperature threshold;
    upon an expiration of the preprogrammed duration of time, categorize each EFn in the cluster as either healthy, derated, or failed, as a function of the EFn_i and the EFn_T comparisons; and
    generate, for each EFn categorized as derated, a derated alert for the EFn; and
  a fuse reallocation module coupled to the health determiner module and configured to:
    for each EFn that is categorized as failed, identify another member of cluster as a target EF having a reallocation potential that is consistent with the preprogrammed configuration of the fuse harness; and
    modify fuse limits of the target EF in accordance with the reallocation potential.

* * * * *